United States Patent [19]

Motoda et al.

[11] Patent Number: 5,589,110
[45] Date of Patent: Dec. 31, 1996

[54] CONTAINER FOR LIQUID METAL ORGANIC COMPOUND

[76] Inventors: Takashi Motoda; Shoichi Karakida; Nobuaki Kaneno; Shigeki Kageyama, all of c/o Mitsubishi Denki Kabushiki Kaisha Hikari Micro-ha Device Kenkyusho, 1 Mizuhara 4-chome, Itami-shi, Hyogo 664, Japan

[21] Appl. No.: 533,462

[22] Filed: Sep. 25, 1995

Related U.S. Application Data

[62] Division of Ser. No. 131,529, Oct. 4, 1993, Pat. No. 5,496,408.

[30] Foreign Application Priority Data

| Nov. 20, 1992 | [JP] | Japan | 4-335049 |
| Feb. 12, 1993 | [JP] | Japan | 5-023121 |
| Mar. 30, 1993 | [JP] | Japan | 5-071381 |

[51] Int. Cl.$^6$ .................................................. B01F 3/04
[52] U.S. Cl. .................... 261/61; 261/120; 261/121.1
[58] Field of Search ........................... 261/61, 120, 121.1

[56] References Cited

U.S. PATENT DOCUMENTS

| 2,405,494 | 8/1946 | Dupuy ........................... 261/120 |
| 2,921,844 | 1/1960 | Hutchison ..................... 261/121.1 |
| 3,049,850 | 8/1962 | Smith ............................ 261/121.1 |
| 3,552,725 | 1/1971 | Ray ................................ 261/120 |
| 4,192,836 | 3/1980 | Bartscher et al. ........... 261/120 |
| 4,410,467 | 10/1983 | Wentworth, Jr. .......... 261/121.1 |
| 4,533,410 | 8/1985 | Ogura et al. ................ 148/175 |
| 4,761,269 | 8/1988 | Conger et al. .............. 422/245 |
| 4,851,016 | 7/1989 | Rylander ...................... 261/120 |
| 4,950,621 | 8/1990 | Irvine et al. ................ 437/81 |
| 4,980,204 | 12/1990 | Fujii et al. .................. 427/255.2 |
| 5,069,930 | 12/1991 | Hussla et al. ............... 427/55 |
| 5,124,088 | 6/1992 | Stumphauzer .............. 261/121.1 |
| 5,190,913 | 3/1993 | Higashiyama et al. .... 505/1 |
| 5,200,388 | 4/1993 | Abe et al. .................... 505/1 |
| 5,304,247 | 4/1994 | Kondo et al. ............... 118/715 |
| 5,336,356 | 8/1994 | Ban et al. ..................... 156/646 |
| 5,354,516 | 10/1994 | Tomita ......................... 261/121.1 |

FOREIGN PATENT DOCUMENTS

| 417507 | 8/1925 | Germany ..................... 261/121.1 |
| 60-138908 | 7/1985 | Japan . |
| 62-105997 | 5/1987 | Japan . |
| 1140712 | 6/1989 | Japan . |
| 233260 | 3/1990 | Japan . |
| 345957 | 4/1991 | Japan . |
| 382763 | 4/1991 | Japan . |

OTHER PUBLICATIONS

Tompa et al, "A Parametric Investigation Of GaAs Epitaxial Growth Uniformity In A High Speed, Rotating–Disk MOCVD Reactor", Journal of Crystal Growth, vol. 93, 1988, pp. 220–227.

Tompa et al, "MOVPE Growth Of II–VI Compounds In A Vertical Reactor With High–Speed Horizontal Rotating Disk", Journal of Crystal Growth, vol. 107, 1991, pp. 198–202.

Primary Examiner—Tim R. Miles

[57] ABSTRACT

A metal organic compound container apparatus for containing a liquid metal organic compound, receiving a carrier gas, and producing a carrier gas stream saturated with vapor of the metal organic compound including a container for containing a liquid metal organic compound; an inlet pipe for introducing a carrier gas into the container, the inlet pipe having an end for immersion in the metal organic compound; a carrier gas flow rate controller for controlling carrier gas flow into the inlet pipe; a first exhaust pipe for exhausting carrier gas from the container at a first flow rate, the first exhaust pipe having an end not contacting the metal organic compound; a first gas flow rate controller for controlling one of pressure and the first flow rate of the carrier gas through the first exhaust pipe; a second exhaust pipe for exhausting carrier gas from the container at a second flow rate, the second exhaust pipe having an end not contacting the metal organic compound; and a second gas flow rate controller for controlling the second flow rate.

2 Claims, 14 Drawing Sheets

CONTAINER FOR LIQUID METAL ORGANIC COMPOUND

This disclosure is a division of patent application Ser. No. 08/131,529, filed Oct. 4, 1993, now Pat. No. 5,496.408.

FIELD OF THE INVENTION

The present invention relates to a compound semiconductor crystal growth apparatus utilizing a vapor phase growth method, and, more particularly, to an improvement in a mechanism for supplying material gas to a reaction tube.

BACKGROUND OF THE INVENTIONS

FIG. 8 is a block diagram illustrating a prior art compound semiconductor crystal growth apparatus for forming a thin film on a plurality of wafers by low pressure chemical vapor deposition. More specifically, in this growth apparatus a chemical reaction of material gases under reduced pressure deposits a solid on the wafers.

More particularly, as illustrated in FIG. 8, a susceptor 1 holding a plurality of wafers 2 is placed in a reaction tube 3 having a cylindrical shape and, after both ends of the reaction tube 3 are closed with lids 4 and 5, a reactive gas (a mixture of material gases) is supplied to the reaction tube 3 via gas supply inlets 6a to 6c. Then, in a state where the pressure in the reaction tube 3 is reduced via an exhaust outlet 8 by an exhaust pump 9, the inside of the reaction tube 3 is heated to a prescribed temperature by applying an electric current to a furnace 7, to deposit a crystalline film on the wafers 2 according to the chemical reaction of the material gas. Here, the flow rate of the material gas required for crystal growth, is controlled by mass flow controllers (hereinafter referred to as MFC) for supplying material gas 10a to 10c, and respective gases are introduced through material gas supply pipes 11a to 11c into a gas mixing pipe 12 for mixing those gases. The material gas mixed thereat is introduced into the reaction tube 3 through gas distributing pipes 13a to 13c, in order to equalize the thickness, or control the composition of or the crystal grown in the reaction tube 3.

By employing the above-described growth apparatus, gas distribution in the reaction tube is improved to a greater extent than that in a case where the reactive gas is provided via a single gas supply inlet from only one end of the reaction tube. However, the flow rates of the mixed material gas flowing through the respective gas distributing pipes are not always made equal to each other by branching the mixed gas supply pipe into plural pipes, and do not result in a thin film having a high quality.

In a low pressure chemical vapor deposition apparatus illustrated in FIG. 9, which is disclosed in Japanese Published Utility Model Application No. Hei.2-33260, according to an output voltage from a mass flow meter (hereinafter referred to as MFM) 15 placed in the gas mixing pipe 12, which output voltage is input to a gas controlling circuit 16, i.e., according to the flow rate of the mixed material gas flowing in the MFM 15, the flow rates of the mixed material gas flowing in the respective MFCs 14a, 14b and 14c which MFCs are respectively placed in the gas distributing pipes 13a, 13b and 13c, are controlled. The percentages of flow quantities for the respective MFCs 14a to 14c are kept at values which are preset at setting appliances 17a to 17c, controlled by the gas controlling circuit 16. As a result, the flow rates of the mixed material gas flowing through the respective gas distributing pipes 13a, 13b and 13c are automatically adjusted while keeping the percentages of flow quantities, and the flow rates of the mixed material gas flowing into the reaction tube 3 equalized.

When, between the material gas supplying MFCs 10a to 10c and the MFCs 14a to 14c, a difference in precision occurs due to errors in manufacture, deterioration over time or the like of the MFCs, i.e., occurs when though the gas controlling circuit 16 makes the flow rates of material gases flowing in the MFCs 14a to 14c equal to those flowing in the MFCs 10a to 10c, the total flow rates of the former MFCs 14a to 14c are smaller than those of the latter MFCs 10a to 10c. As a result the mixed material gas is retarded in the gas mixing pipe 12 located between the MFCs 14a to 14c and the MFCs 10a to 10c, lowering the flow rate of the mixed material gas flowing in the MFM 15. In this structure, however, the flow rates of the reactive gas flowing in the MFCs 14a to 14c are lowered with a decrease in the flow rate of the material gas measured in the MFM 15, and furthermore material gases are retarded in the gas mixing pipe 12, further lowering the flow rates of the material gases, resulting in a vicious circle.

In the prior art compound semiconductor crystal growth apparatus constructed as described above, the material gas is retarded in the gas mixing pipe between the MFCs disposed respectively at prior and latter stage of the gas mixing pipe, due to errors in manufacture, deterioration, over time or the like of the MFCs, and in the worst case, the supply of the mixed material gas stops.

FIG. 10 is a block diagram illustrating a prior art crystal growth apparatus, which is disclosed in Japanese Patent Application No. Hei.1-140712. In the figure, wafers 2 are disposed on a susceptor 31 having a rotation shaft 30. Flow rate variable valves 32a to 32d are disposed in gas distributing pipes 13. Prescribed material liquids are included in bubbling apparatuses 33a to 33c and $H_2$ gas as carrier gas is passed therethrough to generate desired material gases. Shut-off valves 35a to 35d are used for maintenance.

In this apparatus, after the material gases generated in the bubbling apparatus 33a to 33c are mixed in a gas mixing pipe 12, the ratio of flow quantities (distribution ratio) of the mixed material gases flowing through the gas distributing pipes 13 are controlled by the flow rate variable valves 32a to 32d having a prescribed degree of opening, and the mixed material gas is introduced into the reaction tube 3. The material gases introduced into the reaction tube 3 as described above react on the surface or in the vicinity of the wafers 2, growing desired crystals on the wafers 2. Thus, in this apparatus, the uniformity in the layer thickness and composition of the crystal layer grown on the wafer 2 is increased by adjusting the flow rates of the gases flowing through the gas distributing pipes 13. According to this prior art apparatus, however, the inherent nature of each material is not considered. Therefore, in processing a number of large sized wafers, it was difficult to control the uniformity of the layer thickness, the composition and the impurity addition amount of the grown crystal layer sufficiently over the whole surface of the wafer.

In the apparatus illustrated in FIG. 10, the material gases are generated using bubbling apparatus (containers of metal organic material). However, there is a problem that a small amount of metal organic material gas is not stably supplied in the conventional bubbling apparatus.

More particularly, as illustrated in FIG. 11, in conventional bubbling apparatus, by supplying a specific flow rate of a carrier gas, for example, $H_2$, to a material container 53 (hereinafter also referred to as cylinder) from a pipe 51 for introducing carrier gas through an MFC 56 and passing the carrier gas through metal organic material 54, bubbles 55 are generated, and a material gas saturated with vapor from the metal organic material is exhausted from a pipe 52 for exhausting gas. At this time, by setting a control pressure of a pressure control gauge 57 placed in the gas exhausting pipe 52 at a prescribed value, a prescribed amount of material gas having a constant vapor pressure is obtained. However, in order to take out a small amount of material gas, a small amount of carrier gas must be introduced into the metal organic material. The bubbles generated at that time are not continuous bubbles but are intermittent and unstable because the quantity of introduced carrier gas is too small. Therefore, the amount of vapor of the material gas exhausted from the gas exhausting pipe 52 is also unstable, whereby the desired vapor flow from the metal organic material is not produced.

So as to solve the above-described problems, as illustrated in FIG. 12, an end of a carrier gas introducing pipe 51a is not immersed in the metal organic material 54. In this apparatus, a carrier gas supplied to the cylinder 53 does not generate any bubbles, takes in a saturated vapor at the surface of the metal organic material 54 in an equilibrium state, and is exhausted from the gas exhausting pipe 52 as a material gas. However, in this apparatus, as the metal organic material 54 is consumed, the distance between the gas exhausting pipe 52 and the liquid level of the metal organic material 54 is varied. Therefore, the amount of vapor of the material gas taken in the gas exhausting pipe 52 varies with the consumption of the material, whereby a desired flow of material gas is not stably produced.

SUMMARY OF THE INVENTION

It is an object of the present invention to control regularly the flow rate of a mixed material gas even when there is difference in precision due to errors in manufacture and deterioration over time of the MFCs between the material gas supplying MFCs and the reactive gas adjusting MFCs.

It is another object of the present invention to provide an apparatus for producing a compound semiconductor device capable of obtaining uniformity in layer thickness, composition, and impurity concentration in a crystalline layer grown on the entire surface of the wafer.

It is still another object of the present invention to provide a container of metal organic material capable of stably supplying a small amount of material gas.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to the those skilled in the art from this detailed description.

According to a first aspect of the present invention, an apparatus for producing a compound semiconductor device includes first flow rate adjusting means, a gas mixing pipe for mixing the material gases having controlled flow rates, a plurality of gas distributing pipes connected to an end of the gas mixing pipe, second flow rate adjusting means for adjusting the flow of material gas flowing through the gas distributing pipes and for supplying the material gases to a reaction tube, means for detecting pressure in the gas mixing pipe and a control means for, upon receipt of an output from the pressure detecting means, controlling the second flow rate adjusting means to keep the pressure in the gas mixing pipe at a constant value. Therefore, retardation of the material gas between the first and the second flow rate adjusting means is prevented.

According to a second aspect of the present invention, the above-described apparatus for producing a compound semiconductor device further includes a reactive gas by-pass pipe for exhausting a reactive gas from the gas mixing pipe, a by-pass pipe flow rate adjusting means for controlling the reactive gas flowing through the reactive gas by-pass pipe and a control means for, upon receipt of an output from the pressure detecting means, controlling the by-pass pipe flow rate adjusting means to keep the pressure in the gas mixing pipe at a constant value. Therefore, retardation of the material gas between the first and the second flow rate adjusting means is prevented.

According to a third aspect of the present invention, the above-described apparatus for producing a compound semiconductor device further includes a control means for, upon receipt of an output from the pressure detecting means, controlling the first flow rate adjusting means to keep the pressure in the gas mixing pipe at a constant value. Therefore, retardation of the material gas between the first and the second flow rate adjusting means is prevented.

According to a fourth aspect of the present invention, the above-described apparatus for producing a compound semiconductor device further includes a control means for, upon receipt of an output from the pressure detecting means, controlling the carrier gas flow rate adjusting means to keep the pressure in the gas mixing pipe at a constant value. Therefore, retardation of the material gas between the first and the second flow rate adjusting means is prevented.

According to a fifth aspect of the present invention, the above-described apparatus for producing a compound semiconductor device further includes a by-pass pipe for exhausting a carrier gas from the gas mixing pipe. Therefore, in addition to the effect of the above-described aspects, no change of the supply flow rate of the material gas occurs, suppressing the a change in composition of the crystal.

According to a sixth aspect of the present invention, an apparatus for producing a compound semiconductor device in which material gases including a component element of a compound semiconductor crystal are introduced into a reaction tube and growth of a compound semiconductor occurs on wafers disposed in the reaction tube, includes material gas supply pipes which are separated from each other in every group of the component element included in the material gases, and flow rate adjusting means for adjusting flow rates of the material gases flowing through the material gas supply pipes. The apparatus for producing a compound semiconductor device further includes impurity gas supply pipes separated from the material gas supply pipes. Therefore, the distribution ratio of each material gas is set considering the decomposition coefficient of the material, and the impurity concentration in the gas phase and the distribution ratio are controlled.

According to a seventh aspect of the present invention, an apparatus which, containing a liquefied metal organic material, receives a carrier gas and exhausts a material gas produced by the carrier gas saturated with vapor from the metal organic material includes a container containing the liquefied metal organic material, a pipe for introducing a carrier gas, which, having its end immersed in the metal organic material, supplies the carrier gas to the container through a carrier gas flow rate controller, a first pipe for exhausting material gas, which, having its end not in contact with a liquid level of the metal organic material, exhausts a large amount of material gas downstream through a first material gas flow rate controller for controlling one of pressure and flow quantity of the material gas, and a second pipe for exhausting material gas, which, having its end not in contact with the liquid level of the metal organic material, exhausts a small amount of material gas to the downstream through a second material gas flow rate controller. Therefore, a small amount of vapor from the metal organic material is stably obtained due to continuous bubbles.

According to an eighth embodiment of the present invention, the above-described apparatus containing a liquefied metal organic material further includes a pipe for introducing carrier gas, which supplies the carrier gas to the container through a first flow rate controller, a pipe for exhausting material gas, which includes a second flow rate controller at the downstream end thereof, and patching pipes which are provided at respective ends of the carrier gas introducing pipe and the material gas exhausting pipe so as to slide flexibly and having ends floating over a liquid level of the metal organic material while keeping a constant space therebetween so that the ends are not in contact with the liquid level. Therefore, even if the liquid level is lowered as the material is consumed, the distance between the material gas exhausting pipe and the liquid level is kept constant.

DETAILED DESCRIPTION OF THE PREFERRED EMBODIMENT

First Embodiment

Figure 1:
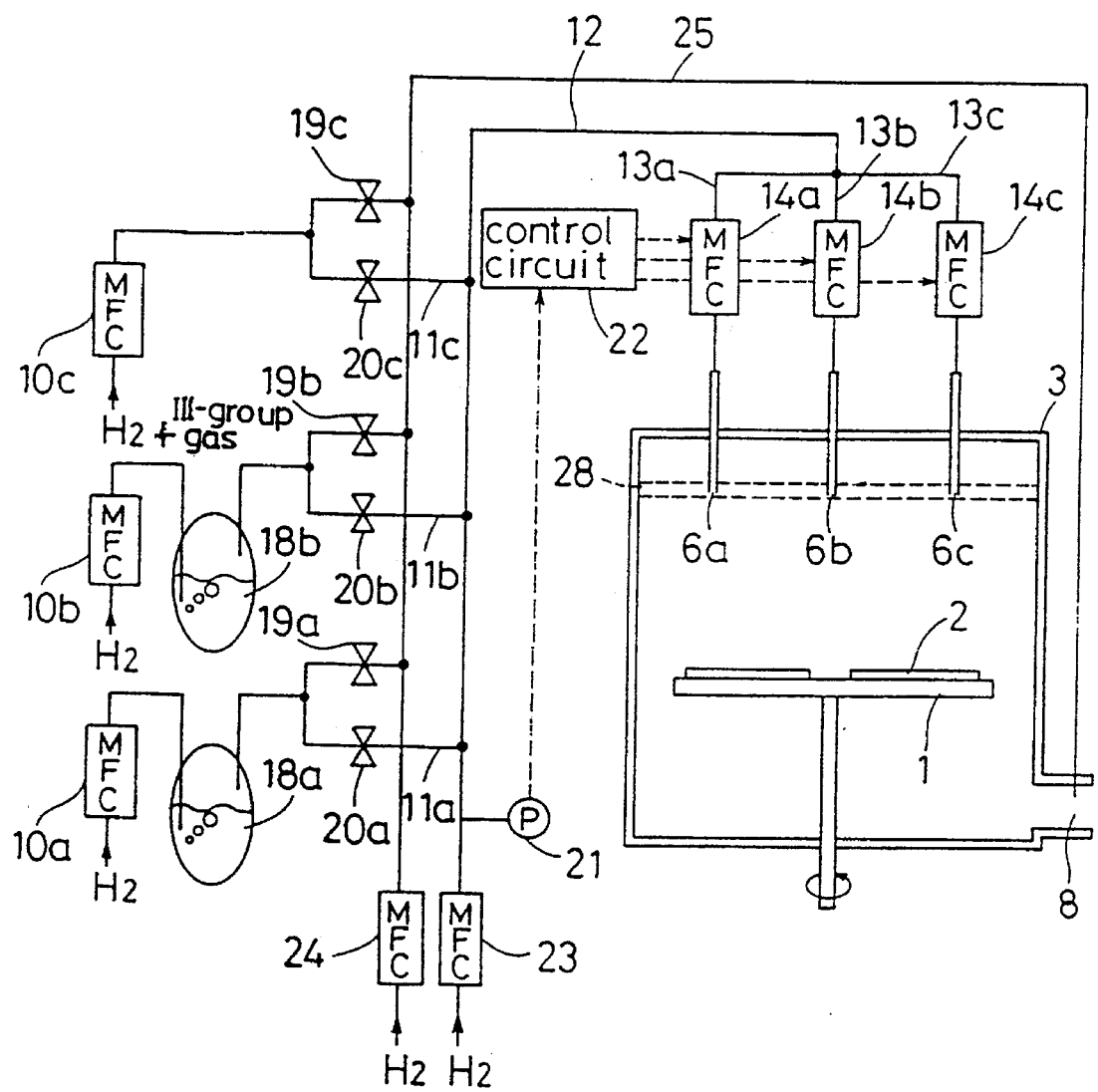
FIG. 1 is a block diagram illustrating an apparatus for producing a compound semiconductor device in accordance with a first embodiment of the present invention.
Figure 8:
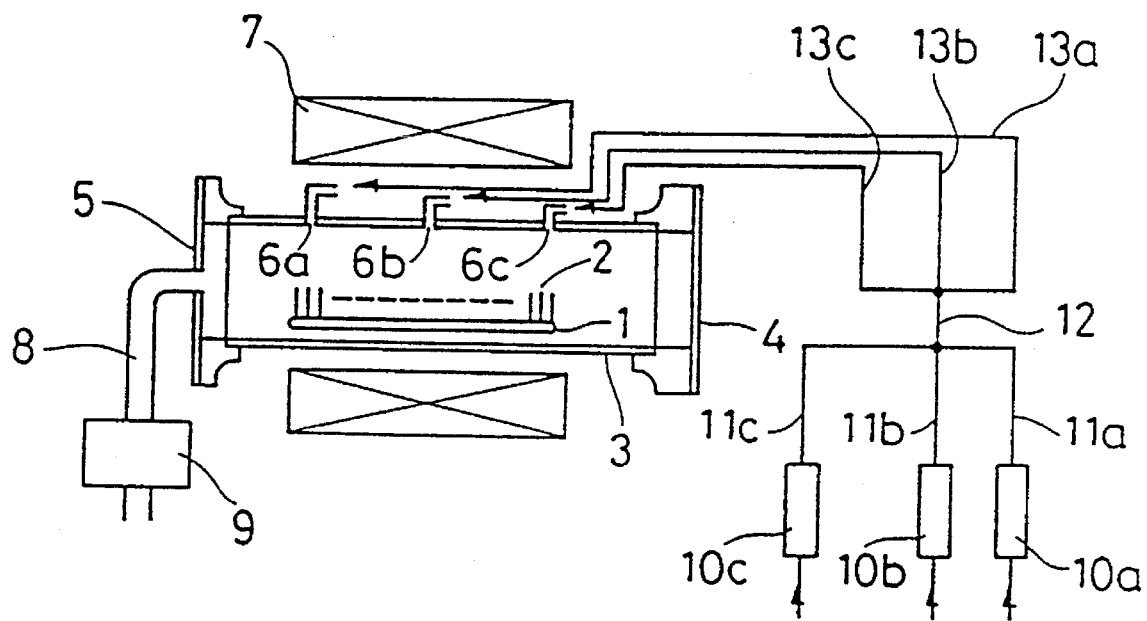
FIG. 8 is a block diagram illustrating a prior art apparatus for producing a compound semiconductor device.
Figure 9:
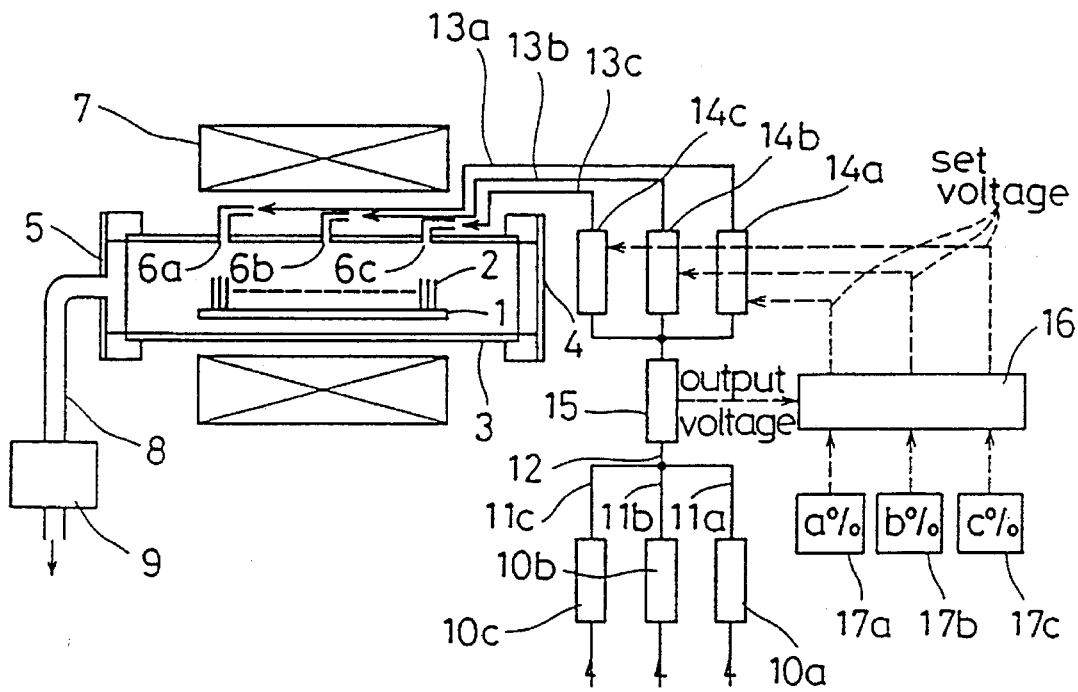
FIG. 9 is a block diagram illustrating a prior art apparatus for producing a compound semiconductor device.
Figure 10:
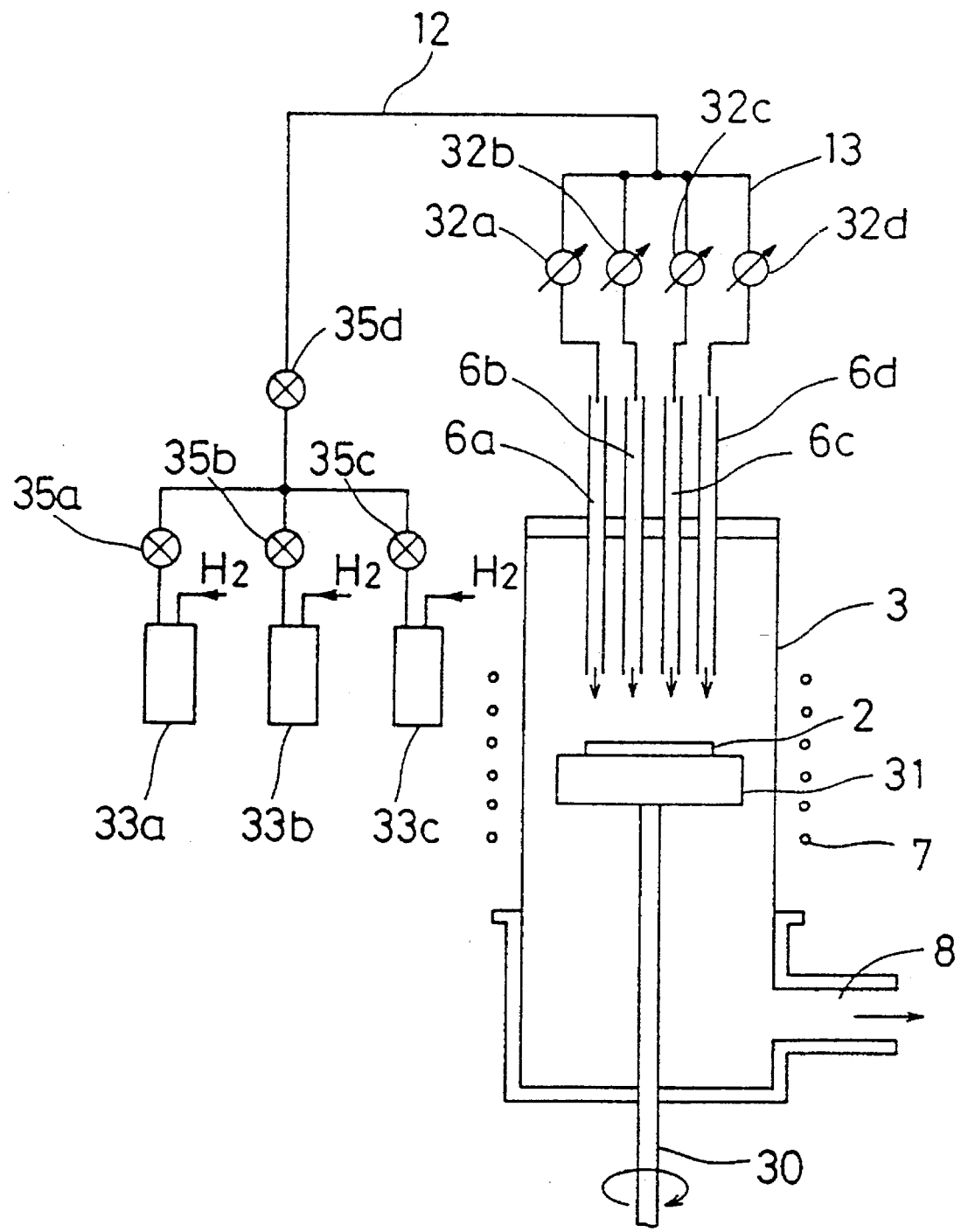
FIG. 10 is a block diagram illustrating a prior art apparatus for producing a compound semiconductor device.
Figure 11:
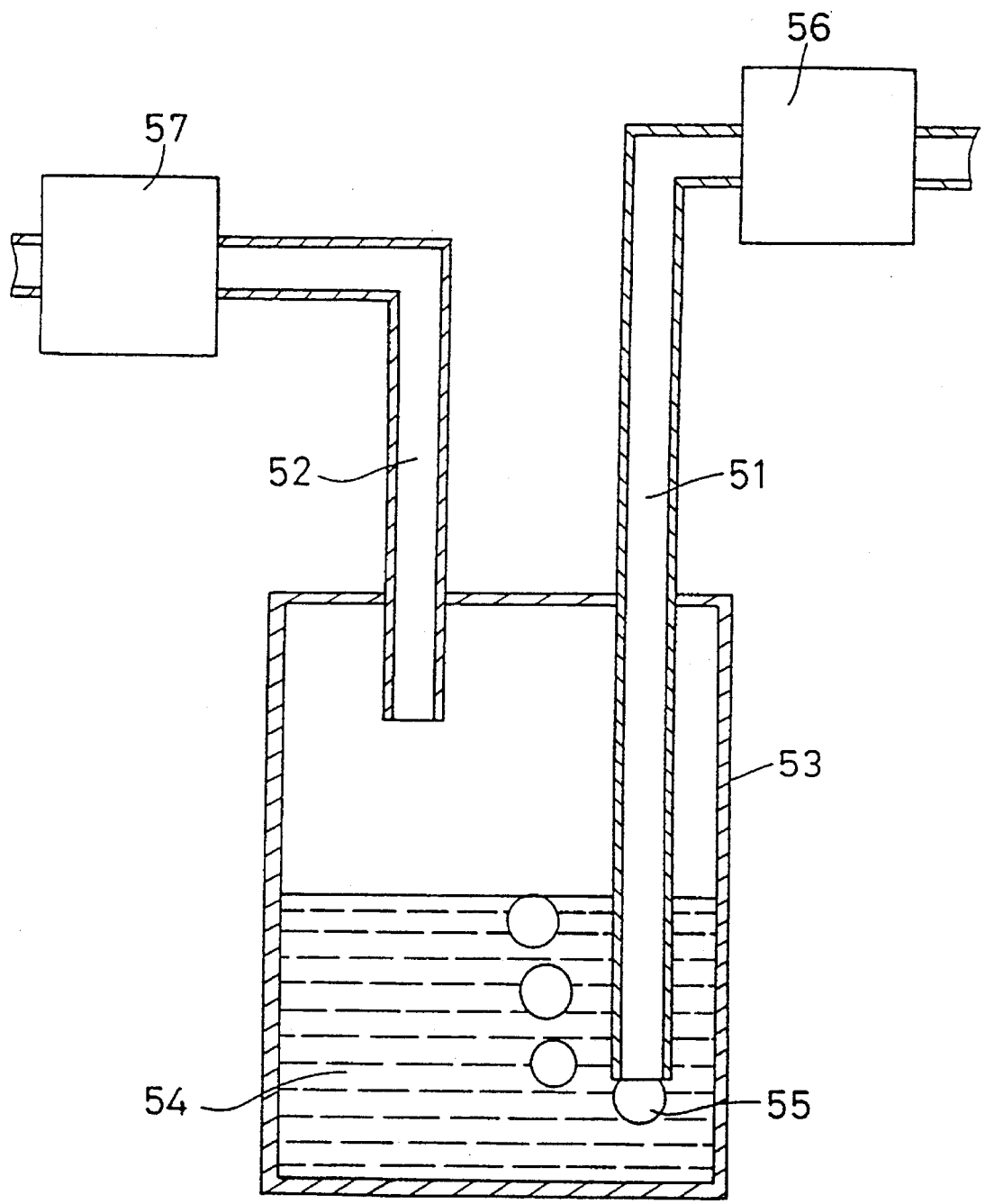
FIG. 11 is a block diagram illustrating a prior art container of a metal organic material.
Figure 12:
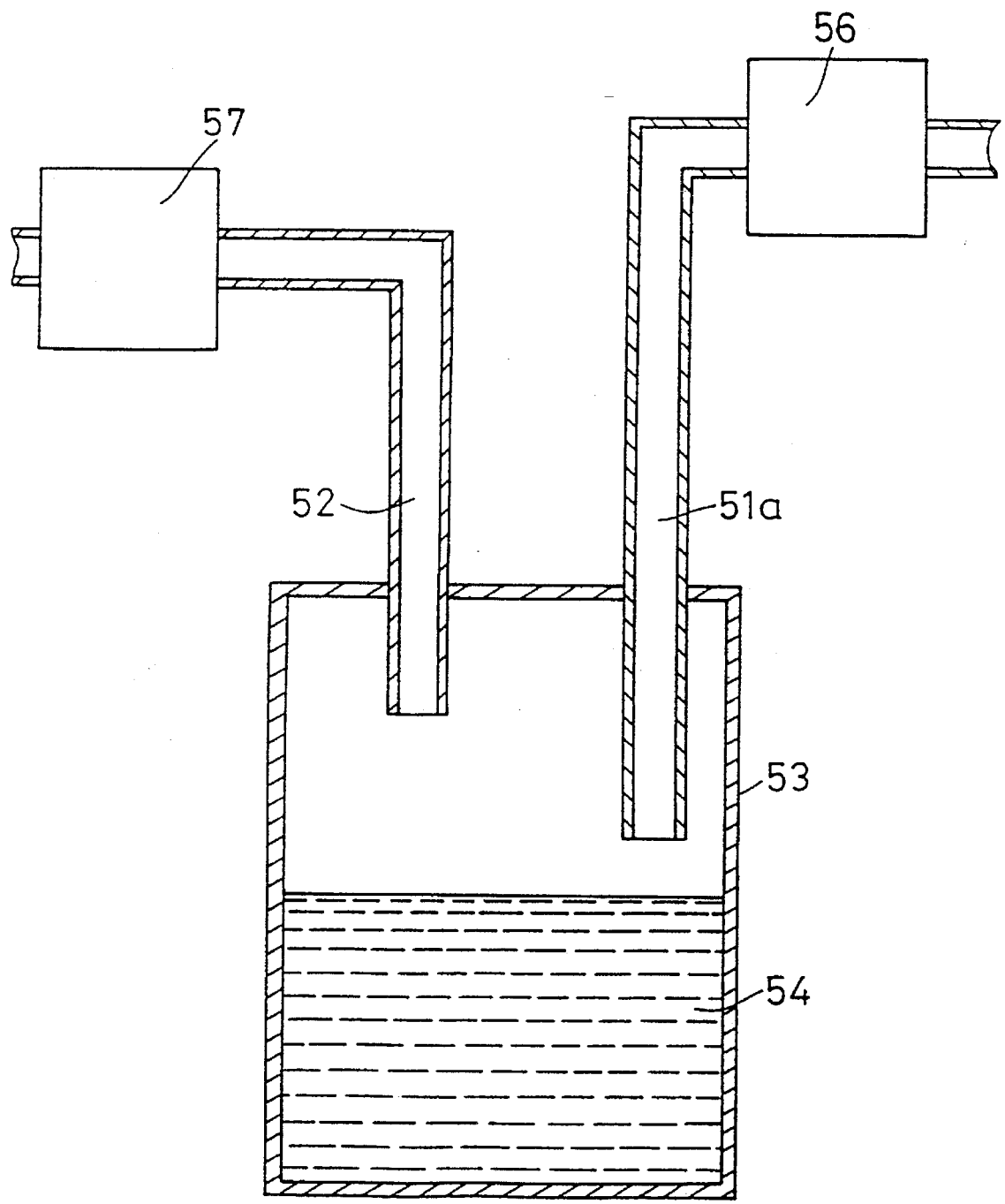
FIG. 12 is a block diagram illustrating a prior art container of a metal organic material.

FIG. 1 is a block diagram illustrating an apparatus for producing a compound semiconductor device in accordance with a first embodiment of the present invention. In the figure, the same reference numerals as those of FIGS. 8 and 9 designate the same or corresponding parts. In bubbling apparatus 18a and 18b, desired material gas flows are obtained by passing the carrier, $H_2$, of which the flow rate is controlled by the material gas supplying MFCs 10a and 10b, through material liquids. While the material gases produced in the bubbling apparatus 18a and 18b and a material gas introduced through the MFC 10c enter the gas mixing pipe 12 via shut-off valves 20a to 20c, these gases also enter a by-pass pipe 25 via shut-off valves 19a to 19c. Hydrogen, as a carrier gas, has flow rate controlled by MFCs 23 and 24 and is constantly supplied to the gas mixing pipe 12 and the by-pass pipe 25. An end of the by-pass pipe 25 is connected to the exhaust outlet 8 of the reaction tube 3. An end of the gas mixing pipe 12 is branched into the three gas distributing pipes 13a to 13c, which are respectively connected to the gas supply inlets 6a to 6c via the reactive gas adjusting MFCs 14a to 14c. A control circuit 22 controls the reactive gas adjusting MFCs 14a to 14c so that the output from the pressure gauge 21 installed to the gas mixing pipe 12 may be constant. A mesh 28 is provided to smooth the flow of the mixed gas coming out of the gas supply inlets 6a to 6c.

Next, description is given of the operations.

Here, a case will be described when a GaAs layer and an AlGaAs layer are successively laminated on the wafers 2. Trimethylgallium ($Ga(CH_3)_3$) is generated from the bubbling apparatus 18a and trimethylaluminium ($Al(CH_3)_3$) is generated from the bubbling apparatus 18b. Here, arsine ($AsH_3$) is supplied from a bomb and is introduced to the MFC 10c with carrier gas ($H_2$).

First, the wafers 2 where crystal growth is to be carried out thereon, are deposited on the susceptor 1 in the reaction tube 3. Consecutively, with the shut-off valves 20a to 20c closed and the shut-off valves 19a to 19c opened, predetermined flow rates of the carrier gas $H_2$ are supplied from the MFCs 23 and 24 so that the pressure in the gas mixing pipe 12 is equal to that in the by-pass pipe 25.

Secondly, with the shut-off valves 19a and 19c closed, the shut-off valves 20a and 20c are opened and trimethylgallium and arsine are introduced into the gas mixing pipe 12. The mixed material gas goes through the gas distributing pipes 13a to 13c and the flow rate of the mixed material gas is adjusted by the MFCs 14a to 14c. Then, the gases are supplied to the reaction tube 3 via the gas supply inlets 6a to 6c. Here, the control circuit 22 controls the MFCs, so that the flow rates of the reactive gases supplied to the gas mixing pipe 12 by the carrier gas flowing through the MFCs 10a, 10c and 23, may be basically equal to the flow rates in the MFCs 14a to 14c connected to the gas distributing pipes 13a to 13c. However, when the actual flow rates are not equal to the designed flow rates due to differences in the precision and deterioration with time of the MFCs 10a, 10c and 23 and the MFCs 14a to 14c, so an adjustment is required in order to equalize these flow rates.

For example, when the actual flow rate of the reactive gas supplied by the MFCs 10a, 10c and 23 is larger then the actual total flow rates of the reactive gases flowing through the MFCs 14a to 14c, the mixed material gas is retarded in the gas mixing pipe 12 and the pressure in the pipe 12 is increased, which is detected by the pressure gauge 21. Then, when the detected result is input into the control circuit 22, the circuit 22 increases the respective flow rates of the material gases flowing in the MFCs 14a to 14c in accordance with the increase in the pressure. As a result, the increased pressure is lowered, resulting in a constant pressure detected at the pressure gauge 21.

On the other hand, when the actual total flow rates of the reactive gases flowing through the MFCs 14a to 14c are larger than the actual flow rate of the reactive gas supplied by the MFCs 10a, 10c and 23, since the pressure detected at the pressure gauge 21 is reduced, the control circuit 22 reduces the respective flow rates of the material gases in the MFCs 14a to 14c, resulting in a constant pressure in the gas mixing pipe 12.

A GaAs crystalline film is grown on the surface of the wafers 2 supported on the susceptor 1 by the mixed material gas which is supplied as described above. Consecutively, so as to laminate an AlGaAs crystalline layer on the GaAs layer, by closing the shut-off valves 20a and 19b and opening the shut-off valves 19a and 20b, the supply of trimethylgallium stops and trimethylaluminium is supplied to the reaction tube 3. Here, since the carrier gas is constantly supplied to the by-pass pipe 25 so that its internal pressure is equal to that of the gas mixing pipe 12, pressure fluctuation in the gas mixing pipe 12 is decreased in switching the gases to suppress the change of the flow rates of the gases. As constructed as described above, a laminated film that has a sharp change in crystalline composition at an interface between the GaAs layer and the AlGaAs crystal layer is obtained.

Thus, in this first embodiment, by controlling the reactive gas adjusting MFCs 14a to 14c with the control circuit 22 so that the pressure in the gas mixing pipe 12 is constant, even when there are differences in precision of between the MFCs 10a to 10c and 23 and the reactive gas adjusting MFCs 14a to 14c, the mixed material gas is not retarded in the gas mixing pipe 12 and further, the supply of the gas does not prevent as in the prior art apparatus obtaining a crystalline film of a uniform thickness.

Second Embodiment

Description will be given of an apparatus for producing a compound semiconductor device in accordance with a second embodiment of the present invention.

Figure 2:
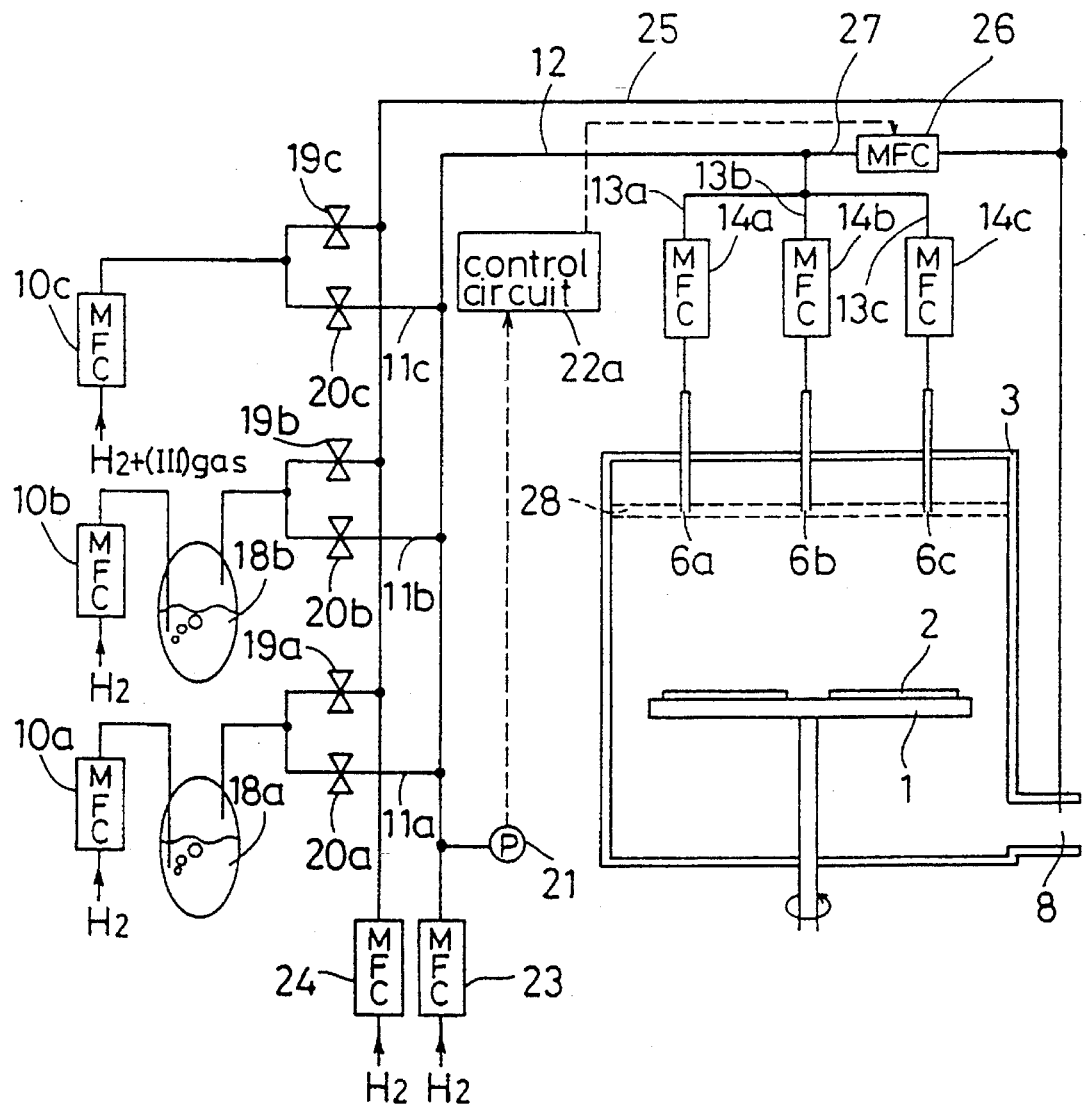
FIG. 2 is a block diagram illustrating an apparatus for producing a compound semiconductor device in accordance with a second embodiment of the present invention.

In this second embodiment, by letting a portion of the gases out of the gas mixing pipe to the by-pass pipe, an increased pressure in the gas mixing pipe is lowered, preventing the gas from being retarded between the MFCs. More particularly, in FIG. 2, an end of a reactive gas by-pass pipe 27 is connected to the gas mixing pipe 12 in the vicinity of the gas distributing pipes 13a to 13c. A by-pass gas adjusting MFC 26 is disposed in the by-pass pipe 27 that is connected to the by-pass pipe 25. A control circuit 22a controls the flow rate of the by-pass gas adjusting MFC 26, receiving an output from the pressure gauge 21 disposed in the gas mixing pipe 12.

Next, description is given of the operations.

The operations of the respective valves in conducting crystal growth are the same as those of the first embodiment. Here, description is given of a case where the gas is retarded due to differences in precision of the MFCs 10a to 10c and 23 and the MFCs 14a to 14c. Similarly to the first embodiment, when the actual flow rate of the reactive gas supplied by the MFCs 10a, 10c and 23 is larger than the actual total flow rates of the reactive gases flowing through the MFCs 14a to 14c, the mixed material gas is retarded in the gas mixing pipe 12 and the pressure in the pipe 12 is increased, which is detected by the pressure gauge 21. Then, when the detected result is input into the control circuit 22a, the circuit 22a increases the flow rate of the material gas flowing in the by-pass gas adjusting MFC 26 in accordance with the increase in the pressure. As a result, the reactive gas equivalent to the excessive pressure flows into the by-pass pipe 25 and the increased pressure in the gas mixing pipe 12 is lowered, resulting in a constant pressure detected at the pressure gauge 21.

According to this embodiment as described above, by including the reactive gas by-pass pipe 27, and by controlling the by-pass gas adjusting MFC 26 disposed in the reactive gas by-pass pipe 27 with the control circuit 22a, so that the pressure detected at the pressure gauge 21 is constant, even if there are differences the precision of the MFCs, the gas is not retarded between the MFCs. Any the excessive reactive gas flows into the by-pass pipe 25 through the reactive gas by-pass pipe 27.

Third Embodiment

Description will be given of an apparatus for producing a compound semiconductor device in accordance with a third embodiment of the present invention.

Figure 3:
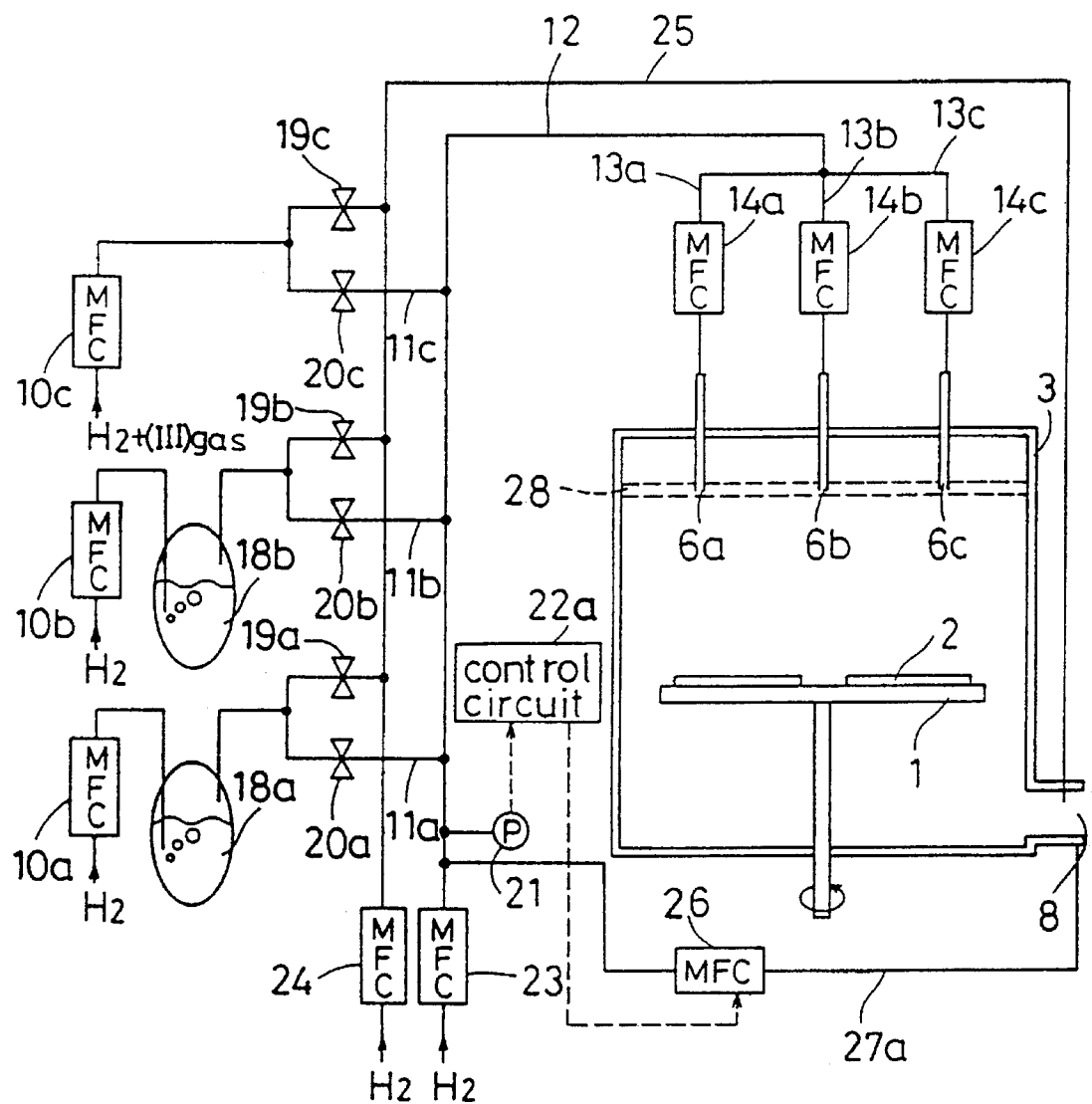
FIG. 3 is a block diagram illustrating an apparatus for producing a compound semiconductor device in accordance with a third embodiment of the present invention.

While in the second embodiment the reactive gas by-pass pipe 27 is connected to the gas mixing pipe 12 in the vicinity of the gas distributing pipes 13a to 13c, as illustrated in FIG. 3, in this third embodiment an end of a carrier gas by-pass pipe 27a is connected to the gas mixing pipe 12 in the vicinity of the MFC 23 supplying the carrier gas. In this construction, when the by-pass gas adjusting MFC 26 disposed in the carrier gas by-pass pipe 27a is adjusting the flow rate of the gas, only the carrier gas is exhausted to the exhaust outlet 8. This makes no change in the supply flow rates of the material gases to the reaction tube 3, suppressing any change in the composition of a growing crystal.

Fourth Embodiment

Description will be given of an apparatus for producing a compound semiconductor device in accordance with a forth embodiment of the present invention.

Figure 4:
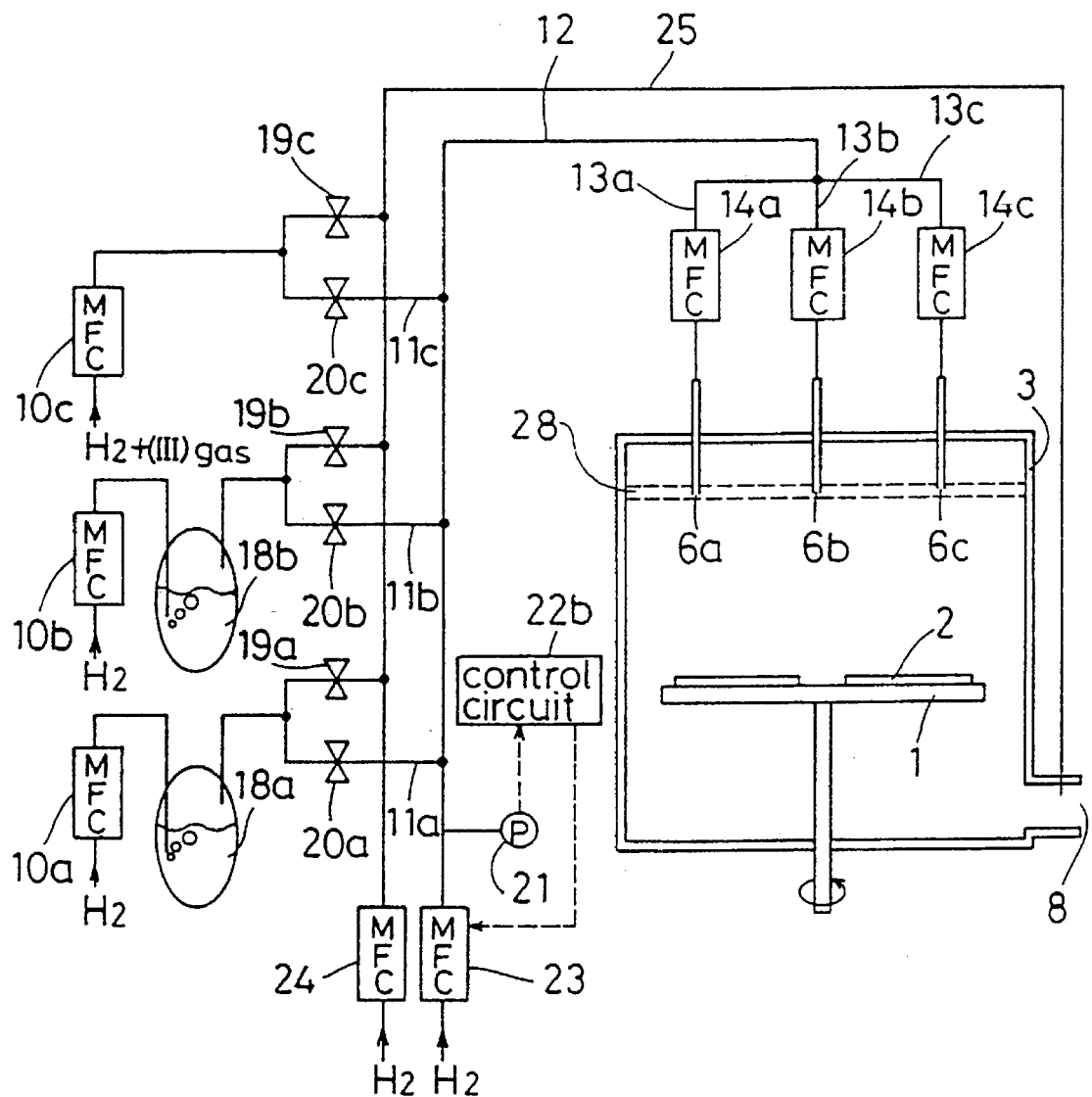
FIG. 4 is a block diagram illustrating an apparatus for producing a compound semiconductor device in accordance with a fourth embodiment of the present invention.

In this fourth embodiment, by controlling the MFC connected to the gas mixing pipe, any increased pressure in the gas mixing pipe is lowered, preventing the gas from being retarded between the MFCs. More particularly, in FIG. 4, a control circuit 22b controls the MFC 23 so that the detected pressure may be constant, receiving an output from the pressure gauge 21 placed in the gas mixing pipe 12.

Next, description is given of the operations.

Similarly to the above-described embodiments, when the actual flow rates of the reactive gas supplied by the MFCs 10a, 10c and 23 is larger than the actual total flow rates of the reactive gases flowing through the MFCs 14a to 14c, the mixed material gas is retarded in the gas mixing pipe 12 and the pressure in the pipe 12 is increased, which is detected by the pressure gauge 21. Then, when the detected result is input into the control circuit 22b, the control circuit 22b decreases the flow rate of the carrier gas flowing in the MFC 23 connected to the gas mixing pipe 12, which constantly supplies carrier gas $H_2$, according to the increased pressure. As a result, the increased pressure in the gas mixing pipe 12 is lowered, producing a constant pressure detected by the pressure gauge 21. On the other hand, when the pressure detected by the pressure gauge 21 is smaller than the predetermined value, the control circuit 22b increases the flow rate flowing in the MFC 23 so that the pressure in the gas mixing pipe 12 is increased to be a predetermined pressure.

According to this fourth embodiment as described above, by controlling the MFC 23 with the control circuit 22b so that the pressure in the gas mixing pipe 12 detected by the pressure gauge 21 is constant, the material gas is not retarded between the MFCs even if there are differences in precision of the MFCs.

Fifth Embodiment

Description will be given of an apparatus for producing a compound semiconductor device in accordance with a fifth embodiment of the present invention.

Figure 5:
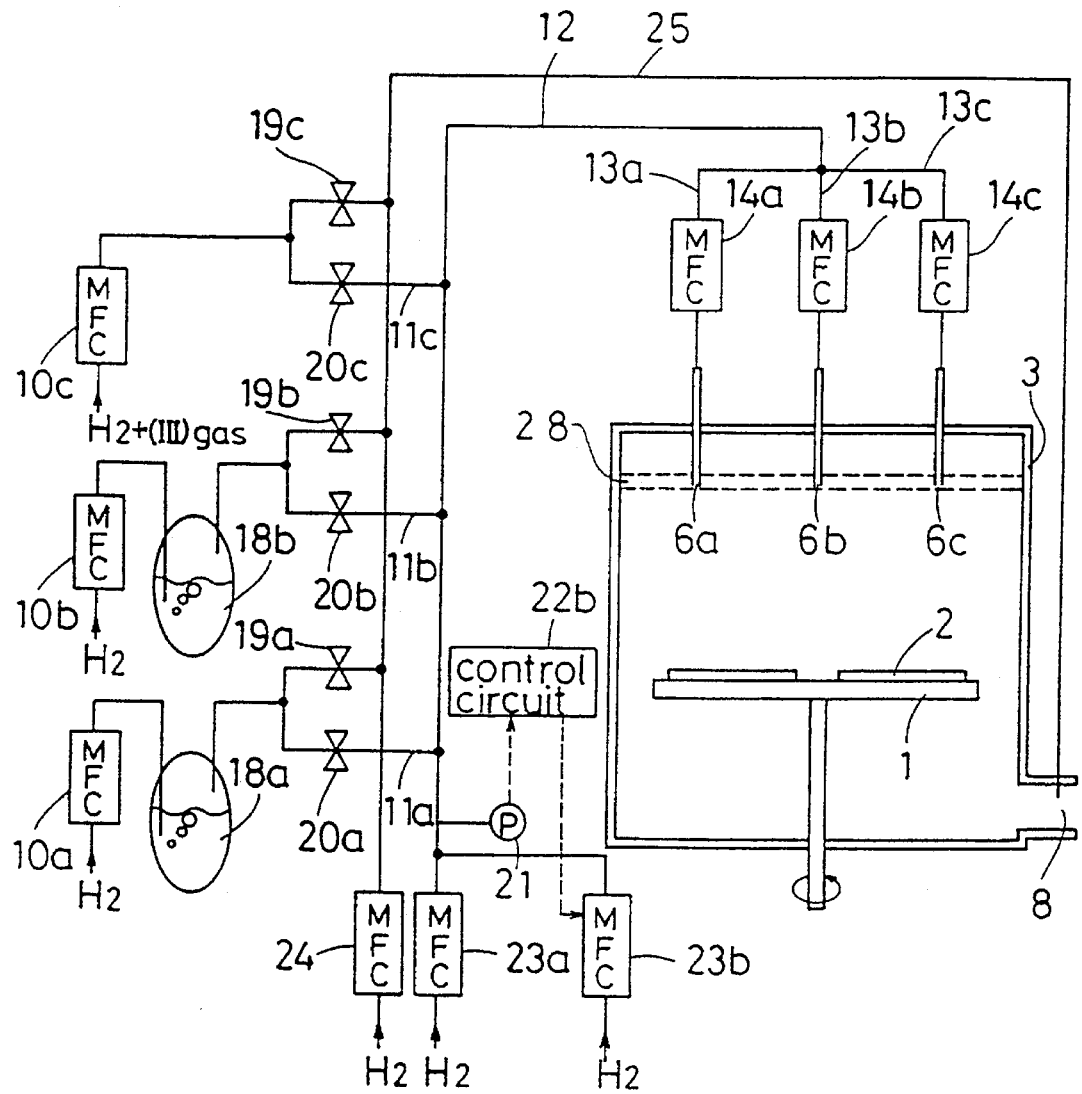
FIG. 5 is a block diagram illustrating an apparatus for producing a compound semiconductor device in accordance with a fifth embodiment of the present invention.

While in the fourth embodiment the pressure in the gas mixing pipe 12 is detected and the MFC 23 is directly controlled by the control circuit 22b, in this fifth embodiment illustrated in FIG. 5, a plurality of MFCs 23a and 23b for supplying carrier gas are disposed in the gas mixing pipe 12, and the MFC 23b is controlled by the control circuit 22b. Here, the MFC 23b, differently from the other MFCs, must have a sufficient capacity to control the supply flow rate of the carrier gas so that the pressure in the gas mixing pipe 12 may be constant when retardation occurs in the gas mixing pipe 12.

Thus, by adjusting the flow rate of the carrier gas with the MFC 23b in order to control the pressure in the gas mixing pipe 12, retardation between the MFCs is avoided with a good response to pressure changes.

While in this fifth embodiment two MFCs 23a and 23b are employed so as to supply the carrier gas to the gas mixing pipe 12, two or more MFCs may be employed and a plurality of MFCs for adjusting the flow rate of the carrier gas may be employed.

Sixth Embodiment

Description will be given of an apparatus for producing a compound semiconductor device in accordance with a sixth embodiment of the present invention.

Figure 6:
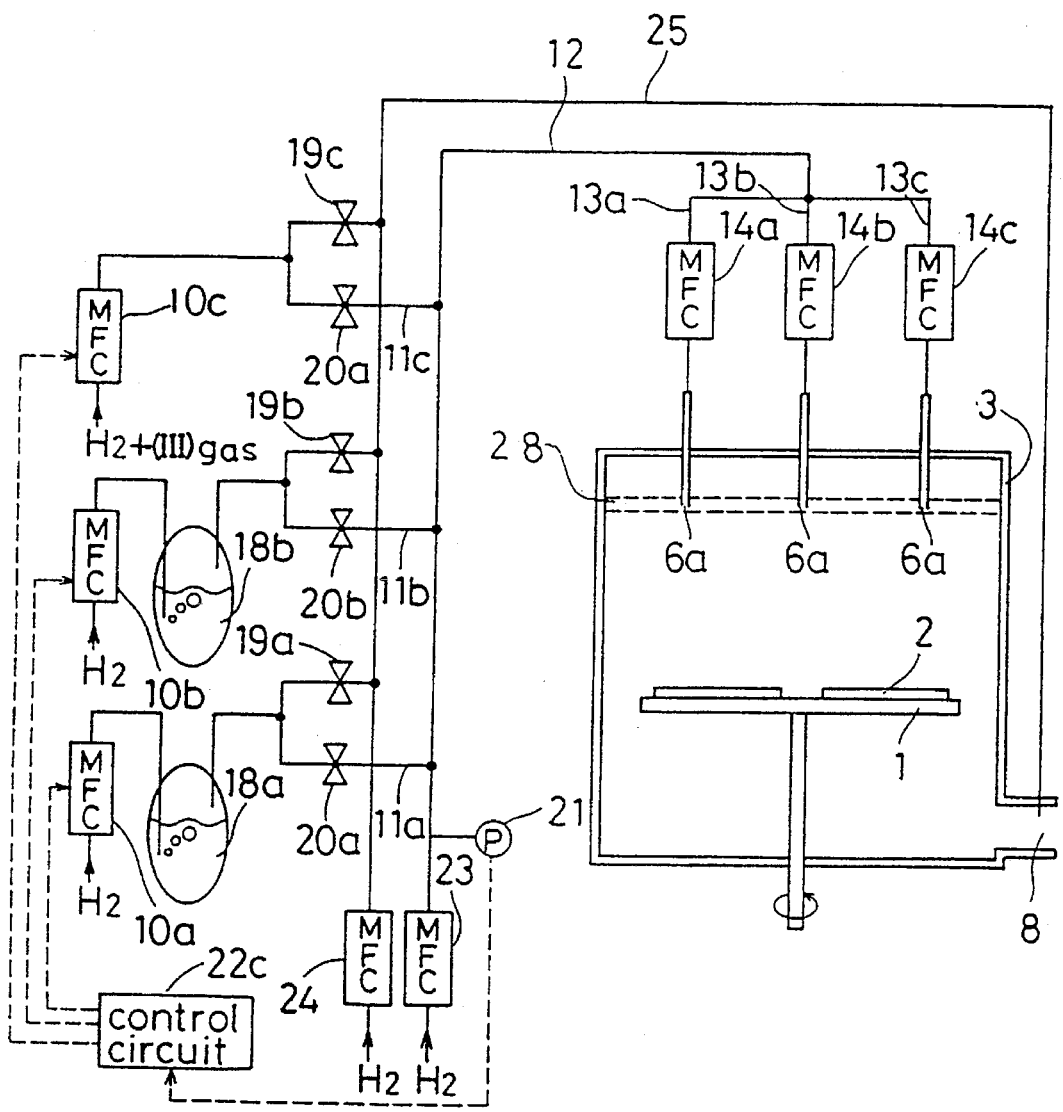
FIG. 6 is a block diagram illustrating an apparatus for producing a compound semiconductor device in accordance with a sixth embodiment of the present invention.

While, in the above-described fourth and fifth embodiments, the increased pressure in the gas mixing pipe 12 is lowered by controlling the MFC supplying the carrier gas to the gas mixing pipe 12, in this embodiment, by controlling the MFCs connected to the bubbling apparatus connected to the material gas supply pipes, retardation of the gas between the MFCs is prevented. In FIG. 6, a control circuit 22c controls the MFCs 10a to 10c, receiving an output from the pressure gauge 21.

Next, description is given of the operations.

Similarly to the above-described embodiments, when the actual flow rate of the reactive gas supplied by the MFCs 10a, 10c and 23 is larger than the actual total flow rates of the reactive gases flowing through the MFCs 14a to 14c, the mixed material gas is retarded in the gas mixing pipe 12 and the pressure in the pipe 12 is increased, which is detected by the pressure gauge 21. Then, when the detected result is input into the control circuit 22c, the control circuit 22c decreases the flow rates in the MFCs 10a to 10c according to the increased pressure, which constantly adjusts the flow rates of carrier gas $H_2$ for generating the respective material gases. As a result, the increased pressure in the gas mixing pipe 12 is lowered, producing a constant pressure detected by the pressure gauge 21. On the other hand, when the pressure detected by the pressure gauge 21 is smaller than the predetermined value, the control circuit 22c increases the flow rates in the MFCs 10a to 10c so that the pressure in the gas mixing pipe 12 is increased to be a predetermined pressure.

According to this sixth embodiment as described above, by controlling the MFCs 10a to 10c with the control circuit 22c, while supplying carrier gas for generating the material gas, so that the pressure in the gas mixing pipe 12 detected by the pressure gauge 21 is constant, the gas is not retarded between the MFCs even if there are differences in precision between the MFCs.

Seventh Embodiment

Description will be given of an apparatus for producing a compound semiconductor device in accordance with a seventh embodiment of the present invention.

While gas retardation between the MFCs is solved in the above-described embodiments, uniformity in the layer thickness, the composition, and impurity addition amount of a crystalline layer grown on the entire surface of the wafer is obtained in this seventh embodiment.

Figure 7:
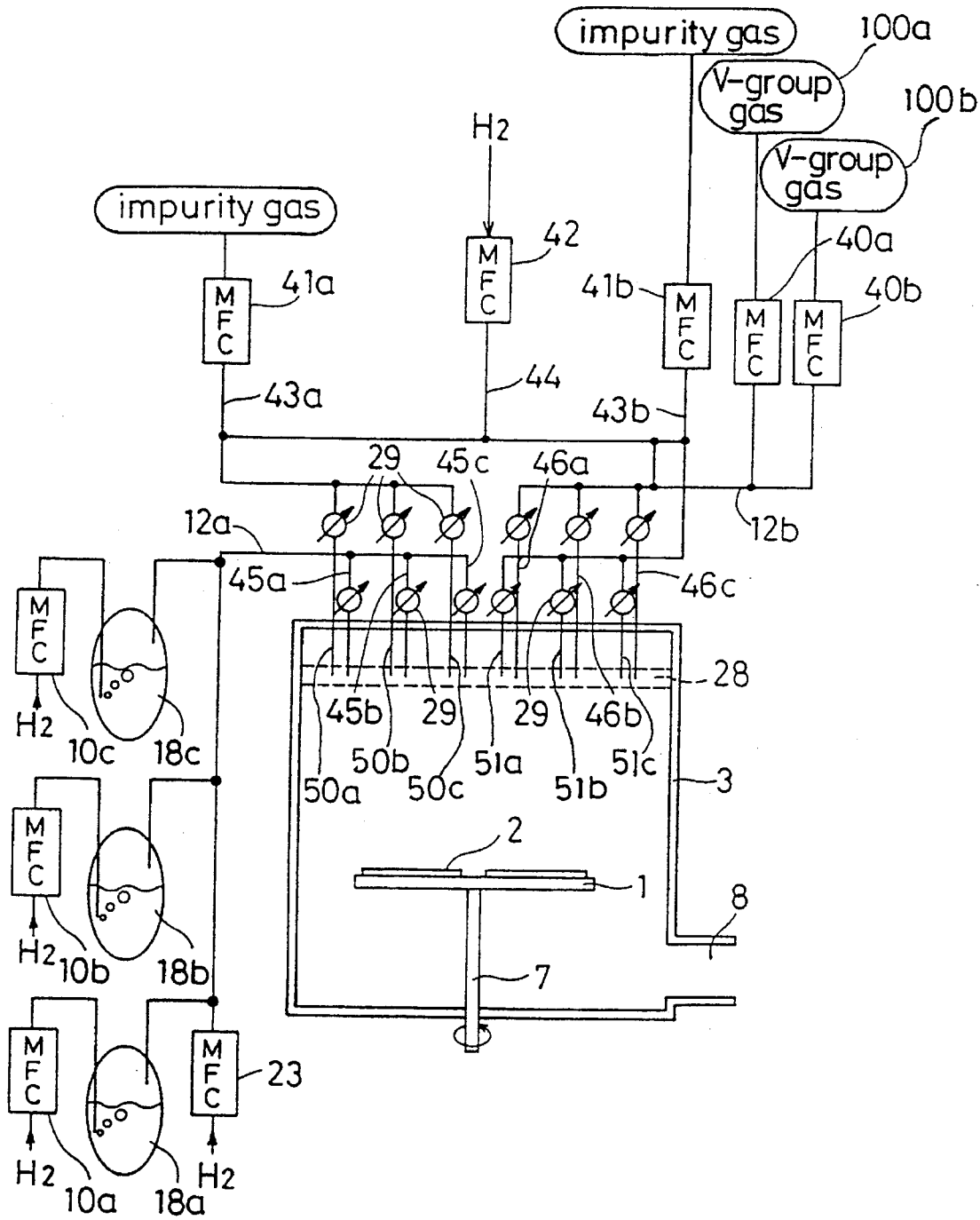
FIG. 7 is a block diagram illustrating an apparatus for producing a compound semiconductor device in accordance with a seventh embodiment of the present invention.

In FIG. 7, MFCs 40a and 40b for supplying a V-group gas source of a Group V element are connected to the reaction tube 3 via a gas mixing pipe 12b. For example, arsine ($AsH_3$) is supplied from a bomb 100a which is connected to the MFC 40a. MFCs 41a and 41b respectively supply a deposit impurity gas to the reaction tube 3 via impurity gas supply pipes 43a and 43b which are separated from each other. An MFC 42 supplies the carrier gas $H_2$ to a gas mixing pipe 12b and the impurity gas supply pipes 43a and 43b via a pipe 44. Here, the bubbling apparatus 18a and 18b supply III-group gases (trimethylgallium, trimethylaluminium) and the bubbling apparatus 18c is not used. Thus, in this seventh embodiment, there are separately provided a gas mixing pipe 12a for supplying the III-group gases to the reaction tube 3 and the gas mixing pipe 12b for supplying the V-group gas ($AsH_3$), and further there are separate the impurity gas supply pipes 43a and 43b and gas mixing pipes 12a and 12b.

Description will be given of a crystal growth method performed employing the above-described apparatus.

The carrier gas $H_2$ is introduced into the bubbling apparatus 10a to 10c filled with the III-group material, which are disposed before the gas mixing pipe 12a, the material is vaporized, and introduced into the reaction tube 3 through the gas mixing pipe 12a. The V-group gas in a bomb is mixed with $H_2$ gas sent from the pipe 44 inside the gas mixing pipe 12b and introduced into the reaction tube 3. Opposite the surface of the wafer 2, the III-group gas and the V-group gas are respectively introduced through gas distributing pipes 45a to 45c and 46a to 46c into which ends of the gas mixing pipes 12a and 12b are respectively branched, and a crystalline layer is grown on the surface of the wafer 2.

Here, in order to make the thickness and the composition uniform, it is necessary to set the respective distribution ratios for the III-group gas and the V-group gas while considering the respective decomposition coefficients of the III-group and V-group materials, respectively. The layer thickness of the crystal mainly depends on the layer thickness distribution of the boundary-layer and the concentration distribution of the III-group material in the boundary-layer. The composition depends on the concentration distribution of the V-group material in the boundary-layer and its decomposition coefficient. Therefore, the distribution ratio of the III-group gas and that of the V-group gas are adjusted resulting in a crystalline film with uniformity in layer thickness and composition.

In this apparatus, the concentration of the III-group gas is made uniform by adjusting the distribution ratios of the III-group gas with needle valves 29 disposed in the gas distributing pipes 45a to 45c downstream of the gas mixing pipe 12a, and the concentration of the V-group gas is made uniform by adjusting the distribution ratios of the V-group gas with the needle valves 29 disposed in the gas distributing pipes 46a to 46c downstream of the gas mixing pipe 12b. In addition, considering that the thickness of the boundary-layer depends on the gas flow rates supplied from the respective gas distributing pipes, the III-group gas and the V-group gas are adjusted respectively to have a predetermined gas flow rate and a predetermined distribution ratio, resulting in uniformity in thickness and the composition of the crystal line layer.

Further, the impurity concentration in the crystal depends on the impurity concentration in the gas phase and the ratio of concentration between the impurity and the elements constituting the crystal in the gas phase, and in order to make the impurity concentration in the crystal uniform, it is necessary to control the impurity concentration in the gas phase and the distribution of the partial pressure for each impurity.

For example, as for an impurity such as silane ($SiH_4$) which is taken in into the III-group side, supposing that $SiH_4$ is supplied from the pipe 43a, the impurity concentration in the crystal depends on the proportion of $SiH_4$ gas to III-group gas in the gas phase, i.e., $SiH_4$/III-group gas ratio. Therefore, in order to obtain the uniformity of Si concentration in the crystal, the distribution ratios of the $SiH_4$ gas in distributing pipes 50a to 50c for supplying $SiH_4$ are adjusted so that the distribution of the $SiH_4$/III-group gas ratio is uniform. On the other hand, as for the impurity taken in into the V-group side, such as hydrogen sulfide ($H_2S$) or hydrogen selenide ($H_2Se$), supposing that such an impurity is supplied from the pipe 43b, the impurity concentration in the crystal depends on the proportion of $H_2S$ gas or $H_2Se$ gas V-group gas in the gas phase, i.e., $H_2S$/V-group or $H_2Se$/V-group gas ratio. Therefore, in order to obtain uniformity of sulfur (S) or selenium (Se) concentration in the crystal, the distribution ratios of the $H_2S$ gas or $H_2Se$ gas in distributing pipes 51a to 51c for supplying $H_2S$ or $H_2Se$ are adjusted so that the distribution of the proportion of $H_2S$/V-group or $H_2Se$/V-group gas ratio is uniform.

In this seventh embodiment as described above, since the III-group gas and the V-group gas are respectively introduced into the reaction tube 3 using the gas mixing pipes 12a and 12b which are separated from each other, the distribution ratios of respective gases are set considering the decomposition coefficient of the crystal material. Therefore, even when the crystal growth is carried out on a number of large sized substrates, for example, 6 or more 2-inch wafers, or 3 or more 3-inch wafers, employing a susceptor of a diameter of 20 cm and more, a crystal having sufficient uniformity on the entire substrate in its layer thickness and its composition is obtained. Since the impurity gas supply pipes 43a and 43b are separate from the gas mixing pipes 12a and 12b, the concentration in the gas phase and the concentration ratio between the impurity gas and the reactive gas introduced from the gas mixing pipes 12a and 12b are easily controlled, resulting in the crystal having the uniformity in impurity concentration.

While description is given of atmospheric chemical vapor deposition apparatus in the embodiments, the present invention is applicable to other deposition apparatus such as lower pressure chemical vapor deposition apparatus.

While the by-passed flow rate of the reactive gas is controlled by the MFC 26 in the second embodiment, a gate mechanism such as electromagnetic valve or needle valve may be employed in place of the MFC 26.

While in the above-described embodiments a description is given of the case where a GaAs crystal and a AlGaAs crystal are successively laminated on the wafers, the same effect is obtained in a case where, by supplying nitrogen as a carrier gas and silane or phosphine as material gas, there is grown a phosphorus silicate glass film or the like, and other crystalline layers crystal such as GaInP, AlGaInP, InGaAs, GaInAsP, AlInAs, AlGaInAs, or AlGaInAsP may be grown.

While in the above-described embodiments two series of pipes comprising the gas mixing pipe 12 supplying the material gases to the reaction tube 3 and the by-pass pipe 25 constantly by-passing and exhausting the material gas to the exhaust outlet 8 are employed, the by-pass pipe 25 is not always required. In such a case, the reactive gas by-pass pipe 27 must be directly connected to the exhaust outlet 8 in the second embodiment.

Eighth Embodiment

Description will be given of a container of metal organic material in accordance with an eighth embodiment of the present invention.

Figure 13:
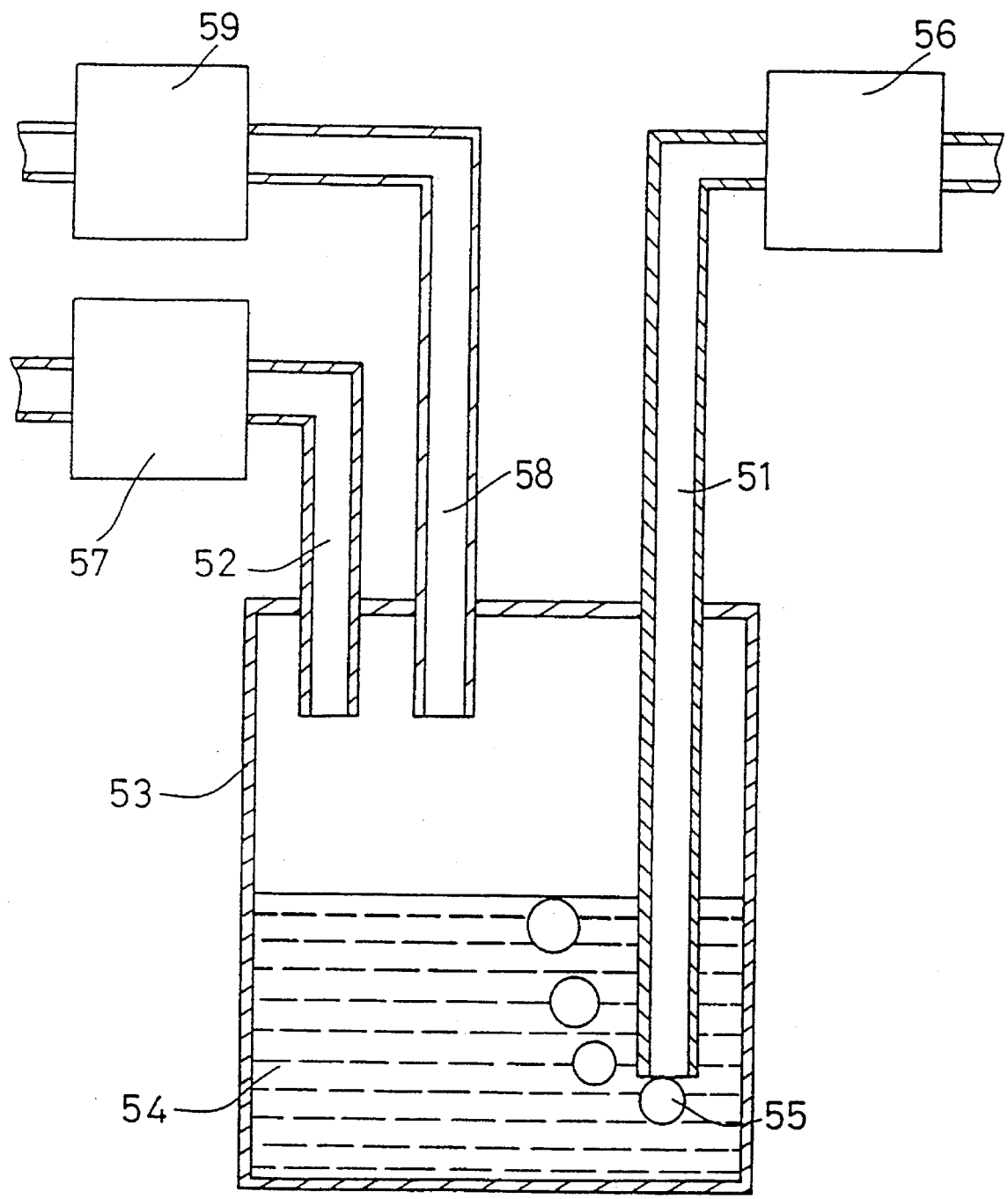
FIG. 13 is a block diagram illustrating a container for a metal organic material in accordance with an eighth embodiment of the present invention.

In FIG. 13, reference numeral 56 designates a first mass flow controller (MFC), a first flow rate control gauge. A second MFC 59, a second flow rate control gauge, is disposed downstream of a second gas exhausting pipe 58.

Next, description will be given of the operations.

For example, when a metal organic material gas of 3 cc per minute is to be obtained, a carrier gas, flow for example $H_2$ at 30 cc per minute, is introduced through a carrier gas introducing pipe 51 to a cylinder 53 by the first MFC 56. By this introduced carrier gas passing through metal organic material 54, bubbles 55 are generated, and a carrier gas saturated with vapor from the metal organic material 54, i.e., a material gas, is exhausted from first and second gas exhausting pipes 52 and 58. At this time, the flow rate of the second MFC 59 is set at 3 cc/min and the pressure of a pressure controller 57 is set at 760 torr. As a result, the material gas at 3 cc/min stably flows downstream of the second MFC 59, while the material gas at 27 cc/min stably flows to the downstream of the pressure controller 57.

Thus, in this embodiment, the second gas exhausting pipe 58 is disposed at the cylinder 53 and a desired small amount of material gas is obtained from the second gas exhausting pipe 58. Therefore, even when a small amount of reactive gas is to be obtained, the continuous bubbles 55 are generated from the sufficient amount of carrier gas, thereby obtaining the material gas having a constant amount of vapor.

Ninth Embodiment

Description will be given of a container of metal organic material in accordance with a ninth embodiment of the present invention.

Figure 14:
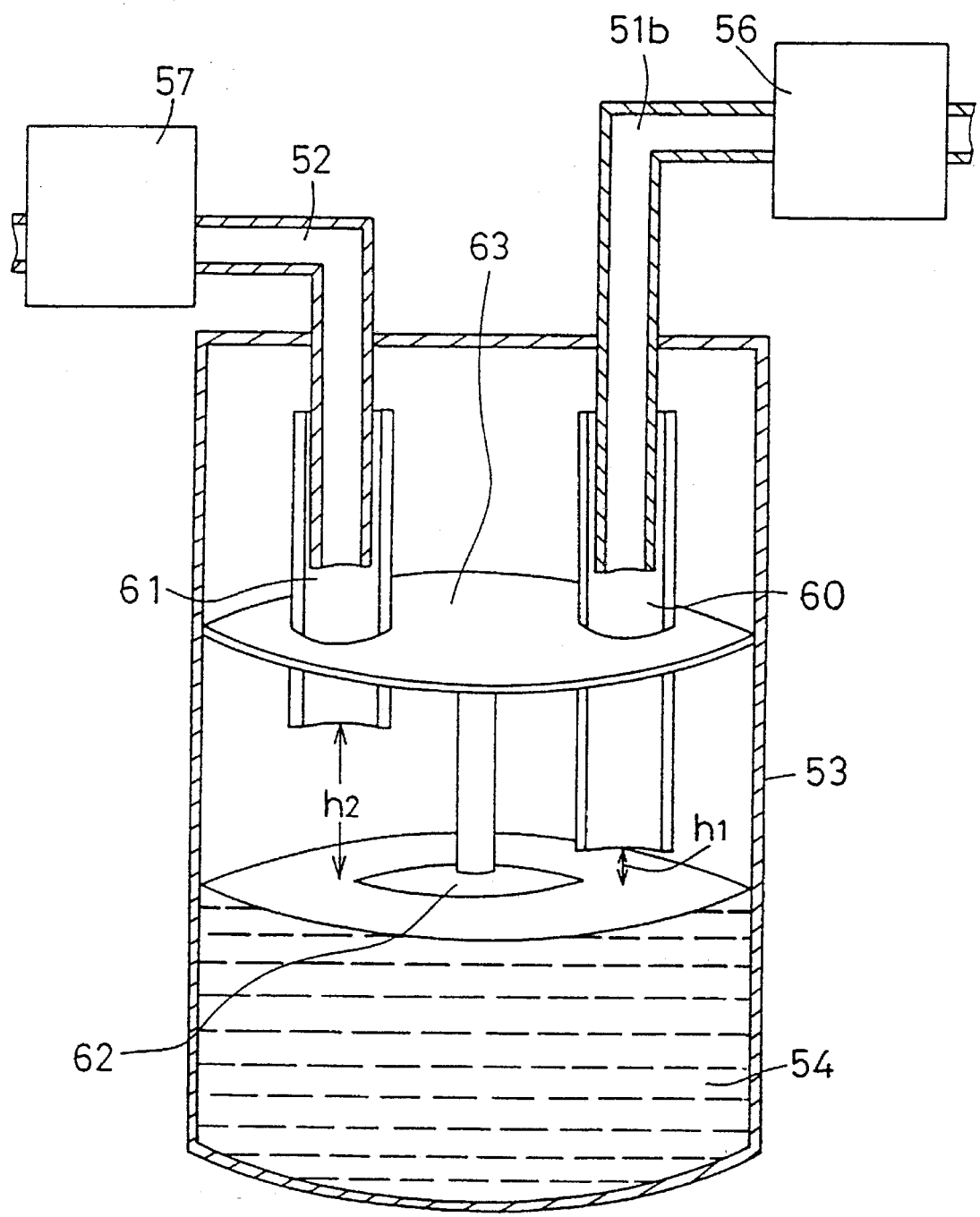
FIG. 14 is a block diagram illustrating a container for a metal organic material in accordance with a ninth embodiment of the present invention.

In FIG. 14, a carrier gas introducing pipe 51b is inserted into a carrier gas introducing pipe 60 having a sliding mechanism, and a gas exhausting pipe 52 is inserted into a gas exhausting pipe 61 having a sliding mechanism. These pipes 60 and 61 are fixed to a partition plate 63 attached to a hollow float 62 so that respective ends of the pipes 60 and 61 maintain heights of h1 and h2 from the liquid level by a liquid level maintaining mechanism comprising the float 62 and the partition plate 63. It is preferred to use a material for the hollow float 62, which is not corroded by the metal organic material 54.

Next, description will be given of the operations.

A prescribed amount of a carrier gas, for example, $H_2$, is introduced by the MFC 56 through a carrier gas introducing pipe 51b to the carrier gas introducing pipe 60 having the sliding mechanism. At this time, because the carrier gas introducing pipe 60 having the sliding mechanism is not immersed in the metal organic material 54, $H_2$ gas does not pass through the metal organic material 54, takes in saturated vapor at the surface of the metal organic material 54 in an equilibrium state without generating bubbles, and is exhausted from the cylinder 53 through the gas exhausting pipe 61 having the sliding mechanism and the gas exhausting pipe 52. At this time, while the liquid level is gradually getting lower as the metal organic material 54 is consumed, the distance between the hollow float 62 which floats on the liquid level of the metal organic material 54 and the partition plate 63 is always constant, the height h2 between the gas exhausting pipe 61 having the sliding mechanism and the liquid level is kept constant, and the amount of vapor from the metal organic material taken in into the gas exhausting pipe 61 does not vary even with the consumption of the material, whereby a desired amount of material gas is stably taken out.

Thus, in this embodiment, since the gas exhausting pipe 61 having the sliding mechanism, which is fixed by hollow float 62 on the liquid level of the metal organic material 54, is provided at an end of the gas exhausting pipe 52, regardless of a change of the liquid level with the consumption of the material, the distance between the end of the pipe 61 and the liquid level of the metal organic material 54 is always kept at height h2, thereby producing the material gas having a constant amount of vapor from the material.

While the pressure controller 57 is provided downstream of the first gas exhausting pipe 52 in the above-described eighth embodiment, a mass flow controller as well as a mass flow adjusting gauge such as needle valve can be used.

As described above, in an apparatus for producing a semiconductor device in accordance with the present invention, by controlling a first or a second flow rate adjusting means of a gas mixing pipe or a carrier gas adjusting means so that the detected pressure in the gas mixing pipe is constant, exhausting a portion of a reactive gas from the gas mixing pipe outside, retardation of the gases between the first and the second flow rate adjusting means is prevented, increasing uniformity in the layer thickness of the crystals.

Further, by supplying the respective material gases as constituents of the crystal through the pipes of different systems for respective material gases and disposing the flow rate adjusting means in the respective pipes, the distribution ratio of each material gas may be set considering the decomposition coefficients of respective materials, thereby resulting in a crystal superior in uniformity in thickness and composition. This improves the characteristics of the semiconductor device, production yield and mass production.

In addition, by introducing the gas for adding the impurity to the reaction tube employing the pipes which are separated from each other, even in the crystal growth on a number of large sized wafers, a crystalline layer having a high uniformity in impurity concentration is produced, thereby improving the characteristics of the semiconductor device, and production yield and mass production.

Further, by using the container of metal organic material of the present invention, a pipe for exhausting material gas is employed. A distance between an end of the material gas exhausting pipe and the liquid level of the metal organic material is kept constant, so that quite a small amount of metal organic material vapor is stably supplied. As a result, the speed of crystal growth is slowed down, and crystal growth control at a level of atomic layers is achieved and a minute mixed crystal ratio, i.e., composition, is easily controlled in the crystal growth of mixed crystals, for example, AlGaAs.

What is claimed is:

1. A metal organic compound container apparatus for containing a liquid metal organic compound, receiving a carrier gas, and producing a carrier gas stream saturated with vapor of the metal organic compound comprising:

a container for containing a liquid metal organic compound;

an inlet pipe for introducing a carrier gas into said container;

a first flow rate controller connected to said inlet pipe for controlling carrier gas flow into said inlet pipe;

an exhaust pipe for exhausting the carrier from said container;

a second flow rate controller connected to said exhaust pipe for controlling flow through said exhaust pipe; and adjusting pipes slidably provided at respective ends of said inlet pipe and said exhaust pipe for positioning of the inlet and the exhaust pipe above and spaced from a surface of a metal organic compound in said container.

2. The container of claim 1 including a float attached to said adjusting pipes for floating in a metal organic compound in said container, thereby maintaining said adjusting pipes spaced from the metal organic compound in said container.

* * * * *

UNITED STATES PATENT AND TRADEMARK OFFICE
CERTIFICATE OF CORRECTION

PATENT NO.   : 5,589,110
DATED        : December 31, 1996
INVENTOR(S)  : Motoda et al.

It is certified that error appears in the above-indentified patent and that said Letters Patent is hereby corrected as shown below: On the title page, Item 73: Assignee; insert the following:

--Mitsubishi Denki Kabushiki Kaisha,

Tokyo, Japan--;

Column 14, Line 27, after "carrier" insert --gas--.

Signed and Sealed this

Twenty-fourth Day of November, 1998

Attest:

BRUCE LEHMAN

Attesting Officer

Commissioner of Patents and Trademarks